United States Patent [19]

Suzuki et al.

[11] 4,128,813
[45] Dec. 5, 1978

[54] AMPLIFIER

[75] Inventors: Tadao Suzuki; Tadao Yoshida, both of Tokyo, Japan

[73] Assignee: Sony Corporation, Tokyo, Japan

[21] Appl. No.: 852,971

[22] Filed: Nov. 18, 1977

[30] Foreign Application Priority Data

Nov. 25, 1976 [JP] Japan .................................. 51-141519

[51] Int. Cl.$^2$ ............................................. H03F 3/18
[52] U.S. Cl. ..................................... 330/264; 330/267; 330/269; 330/296
[58] Field of Search ............... 330/263, 264, 267, 269, 330/277, 296, 297, 310, 311

[56] References Cited

U.S. PATENT DOCUMENTS

| 2,994,834 | 8/1961 | Jones ................................. 330/310 X |
| 4,021,748 | 5/1977 | Yoshida et al. ....................... 330/269 |

*Primary Examiner*—Lawrence J. Dahl

*Attorney, Agent, or Firm*—Lewis H. Eslinger; Alvin Sinderbrand

[57] ABSTRACT

An amplifier comprised of a field effect transistor whose gate electrode is adapted to receive an input signal. An impedance converter couples the input signal to the gate electrode of the field effect transistor, the impedance converter being formed of n impedance converting stages, each stage having a relatively low output impedance. A voltage limiting circuit is connected between the source of input signal and the gate electrode of the field effect transistor so as to limit the forward biasing of the field effect transistor. This voltage limiting circuit includes m voltage-limiting elements, wherein n and m are integers (1, 2, 3, . . . ) and n is equal to or greater than m. In a preferred embodiment, the amplifier is formed of two field effect transistors connected in push-pull relation, each field effect transistor being provided with an impedance converter and a voltage-limiting circuit as described above.

21 Claims, 3 Drawing Figures

AMPLIFIER

BACKGROUND OF THE INVENTION

This invention relates to an amplifier and, more particularly, to an amplifier using a field effect transistor which is adapted to respond rapidly to a pulse signal, such as a pulse width modulated signal, or other rectangular wave signal.

Amplifier circuits for use with pulse signals should be capable of responding rapidly to the supplied pulse signal. Thus, if a bipolar transistor is used, there should be minimal delay in turning the transistor ON and OFF so that the amplified pulse signal appears as a rectangular waveform having sharp leading and trailing edges. Because of minority carriers which are stored in the base region when a bipolar transistor is in saturation, a delay will elapse until these stored carriers are sufficiently discharged so that the transistor can be turned OFF.

Another problem encountered in pulse amplifiers using bipolar transistors is longitudinal amplitude distortion in the output voltage. This distortion may occur when bipolar transistors are connected in push-pull relation. As described in our U.S. Pat. No. 3,999,143, such longitudinal amplitude distortion can be eliminated if a pair of diodes is connected between the base electrode of one of the push-pull transistors and the usual reverse current by-pass diode that is provided in the event that the load is a loudspeaker system supplied through a choke coil.

While the circuit described in the aforementioned patent operates satisfactorily, a different problem arises when field effect transistors (FET's) are used. Since the FET does not rely on storage carriers for its operation, there is no need to discharge stored carriers in order to turn the FET OFF, as in the case of a bipolar transistor. However, the depletion-type FET, such as a junction FET, and particularly a vertical channel junction FET exhibits inherent input gate capacitance which varies as a function of the gate-source voltage. This gate capacitance cooperates with the output impedance of the drive circuit normally used with the FET to impart a time delay in the turning ON and turning OFF of the FET. This delay is a detriment to the operation of the FET in a pulse amplifying circuit, particularly since this delay can result in rounded leading and trailing edges of the amplified pulse.

Accordingly, it is desirable to drive an FET having inherent input gate capacitance with a circuit of low output impedance. This serves to minimize the RC time delay due to the input gate capacitance of the FET. However, since this input gate capacitance varies as a function of the gate-source voltage, the input gate capacitance tends to increase remarkably when the gate-source circuit of the FET is forward biased. For example, in a N-channel FET, a negative gate-source voltage is effective to turn the FET OFF, and the FET is turned ON when the negative gate-source voltage decreases to a level which forward-biases the gate-source circuit. If the forward bias voltage applied to the gate-source circuit of the N-channel FET becomes positive, the voltage-dependent input gate capacitance thereof increases substantially. This large increase in the input gate capacitance means that an increased amount of power is needed to drive the FET. Furthermore, the drain-source resistance of the transistor when the gate-source voltage is positive is much greater than when a zero forward bias voltage or a low level negative forward bias voltage is applied. This high source-drain resistance means that a significant amount of input power is lost thereby.

Bias voltages of opposite polarities have similar effects upon a P-channel FET. That is, a positive voltage is used to turn OFF the P-channel FET, and the forward bias region is reached when the gate-source voltage is reduced to a low positive level.

As a numerical example, the FET will be forward biased when a gate-source voltage of 0.7 volts (negative for a N-channel FET and positive for a P-channel FET) is applied. As this gate-source voltage is reduced, the input gate capacitance increases remarkably. At zero gate-source voltage a substantial increase in input power is needed. This condition is further aggravated when the forward bias voltage is increased above zero for the N-channel FET and decreased below zero for the P-channel FET.

In our U.S. Pat. No. 4,021,748, an FET pulse amplifier is described which includes a circuit to prevent the FET from being over-biased in the forward direction. However, in that circuit, a simple diode is connected in parallel with the gate-source circuit. This limits the forward gate-source voltage to, for example, 0.7 volts. As mentioned above, this positive forward bias voltage applied to the gate-source circuit of a N-channel FET results in such a large input gate capacitance as to require a significant amount of power for driving the FET and the load coupled thereto.

OBJECTS OF THE INVENTION

Therefore, it is an object of the present invention to provide an amplifier circuit using an FET which avoids the problems and deficiencies of prior art circuits.

Another object of this invention is to provide an improved pulse amplifier circuit using at least one FET.

A further object of this invention is to provide an amplifier using an FET having fast turn-ON and turn-OFF response times.

An additional object of this invention is to provide an improved FET pulse amplifier wherein the amplified pulses derived therefrom have sharp leading and trailing edges.

Still another object of this invention is to provide an FET amplifier wherein the inherent input gate capacitance is limited so as to avoid the necessity of overdriving the FET because of an otherwise large input gate capacitance.

A still further object of this invention is to provide an improved FET amplifier which does not require as much power as was heretofore necessary to drive it.

Yet another object of this invention is to provide an FET amplifier wherein the drain-source resistance thereof is limited to a relatively low value when the FET is ON.

A further object of this invention is to provide an improved FET amplifier formed of at least one FET which is driven by an impedance converter having a relatively low output impedance.

An additional object of this invention is to provide a push-pull FET amplifier wherein the inherent input voltage-dependent gate capacitance of each FET is maintained at a relatively low value by limiting the maximum gate-source voltage which can be applied to each FET.

Various other objects, advantages and features of the present invention will become readily apparent from the ensuing detailed description, and the novel features will be particularly pointed out in the appended claims.

SUMMARY OF THE INVENTION

In accordance with this invention, an amplifier is comprised of an FET whose gate electrode is adapted to be supplied with an input signal from an input supply circuit. An impedance converter couples the input supply circuit to the FET gate electrode, the impedance converter being formed of n impedance converting stages, each stage having a relatively low output impedance. A voltage limiting circuit is connected between the input signal supply circuit and the FET gate electrode to limit the forward biasing of the FET, this voltage limiting circuit including m voltage-limiting elements, wherein n and m are integers (1, 2, 3, ...) and n is equal to or greater than m. In one embodiment, the amplifier is formed of two FET's connected in push-pull relation, and a respective impedance converter is coupled between the input signal supply circuit and the gate electrode of each of FET, while a respective voltage-limiting circuit is connected between the input signal supply circuit and each FET gate electrode.

BRIEF DESCRIPTION OF THE DRAWINGS

The following detailed description, given by way of example, will best be understood in conjunction with the accompanying drawings in which.

DETAILED DESCRIPTION OF SOME OF THE PREFERRED EMBODIMENTS

Figure 1:
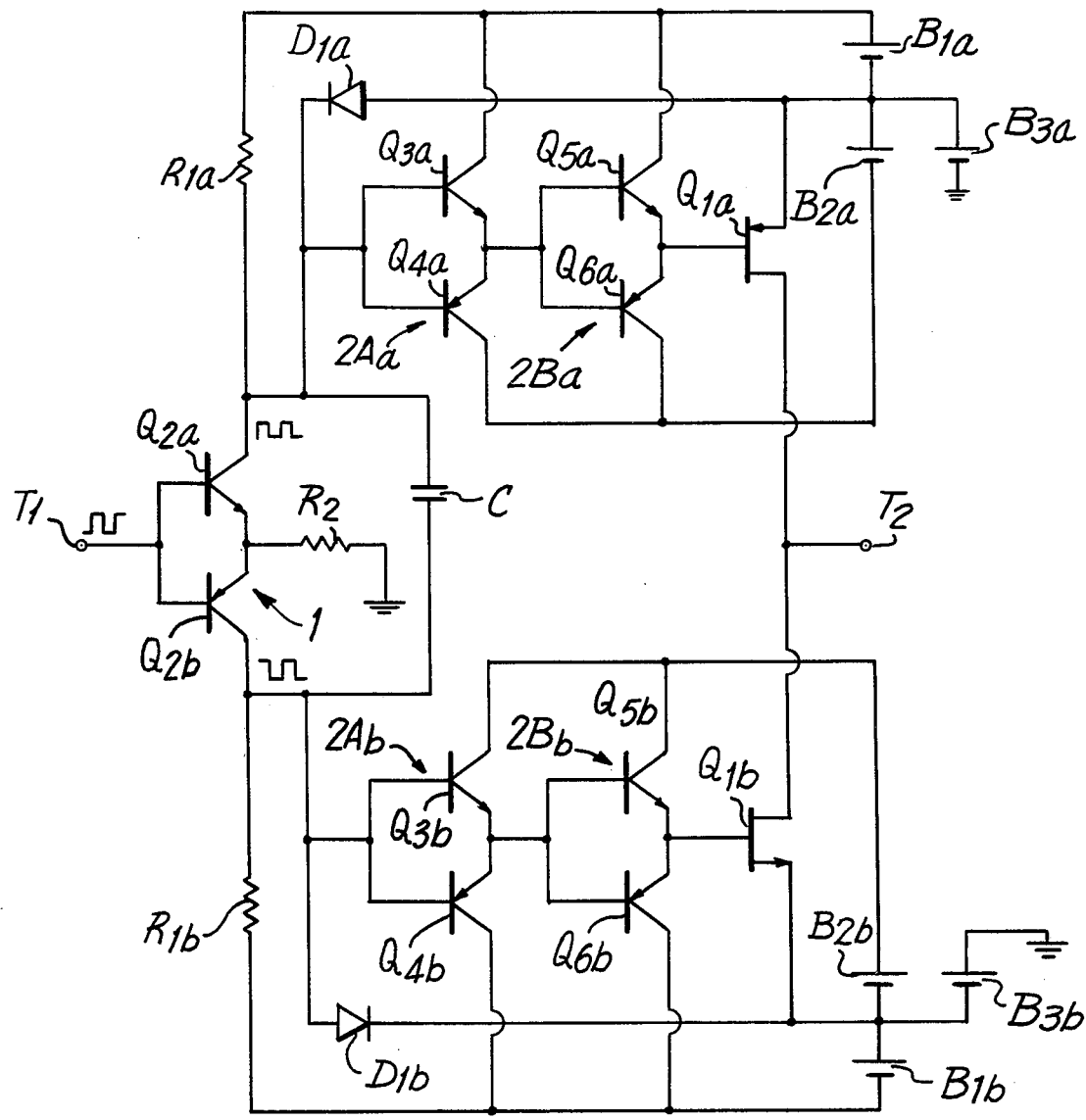
FIG. 1 is a schematic diagram of a preferred embodiment of the present invention.

Turning now to the drawings, wherein like reference numerals are used throughout, and in particular to FIG. 1, there is illustrated a preferred embodiment of the present invention. A pair of FET's $Q_{1a}$ and $Q_{1b}$ are connected in push-pull relation. These FET's are shown as complementary devices, but it is contemplated that both FET's may be either N-channel or P-channel devices. As shown, FET $Q_{1a}$ is a P-channel device and FET $Q_{1b}$ is a N-channel device, the respective drain electrodes of these FET's being connected in common to an output terminal $T_2$. The source electrode of each FET is adapted to receive a DC energizing voltage, and each gate electrode is adapted to receive a signal, such as a pulse signal for amplification so that the amplified pulse signal can be used to drive a load (not shown) which may be connected to output terminal $T_2$.

An input signal supply circuit 1 is coupled to an input terminal $T_1$ so as to receive the signal which will be supplied to the FET's. For the purpose of this description, it will be assumed that the received signal is a pulse signal, such as a PWM signal, or other rectangular wave signal. Input signal supply circuit 1 is shown as being formed of complementary transistors wherein transistor $Q_{2a}$ is an NPN transistor and transistor $Q_{2b}$ is a PNP transistor. The base electrodes of these transistors are connected in common to input terminal $T_1$ and the emitter electrodes thereof are coupled through an emitter resistor $R_2$ to a reference potential, such as ground.

If the pulse signal applied to input terminal $T_1$ alternates between positive and negative levels, it is appreciated that transistors $Q_{2a}$ and $Q_{2b}$ are alternately conductive. The signal derived at the collector electrode of transistor $Q_{2a}$ in response to the positive portion of the input pulse signal is used to drive FET $Q_{1a}$; and the signal derived at the collector electrode of transistor $Q_{2b}$ in response to the negative portion of the input pulse signal, is used to drive FET $Q_{1b}$. A capacitor C is connected between the collector electrodes of transistors $Q_{2a}$ and $Q_{2b}$ for shaping the signal waveforms at these collector electrodes. In addition, collector resistors $R_{1a}$ and $R_{1b}$ are coupled to the collector electrodes of transistors $Q_{2a}$ and $Q_{2b}$, respectively, for supplying positive and negative DC energizing voltages thereto.

A drive circuit is connected between signal supply circuit 1 and FET $Q_{1a}$, and a drive circuit is connected between the signal supply circuit and FET $Q_{1b}$. Each drive circuit is an impedance converting circuit formed of n stages. In the illustrated example, each impedance converting circuit is formed of two stages. Hence, stages $2A_a$ and $2B_a$ are connected in cascade between signal supply circuit 1 and the gate electrode of FET $Q_{1a}$. Similarly, the impedance converting circuit formed of two stages $2A_b$ and $2B_b$ are connected in cascade between the signal supply circuit and the gate electrode of FET $Q_{1b}$. Although two stages are shown for each of the impedance converting circuits, it should be appreciated that n may be any integer, such as 1, 2, ... n. The impedance converting circuits are provided with a relatively low output impedance. This is because the output impedance of each impedance converting stage cooperates with the inherent input gate capacitance of the respective FET's $Q_{1a}$ and $Q_{1b}$ to provide a time constant delay in charging and discharging, respectively, this capacitance. The time constant delay results in a corresponding delay in turning ON and turning OFF the FET. Thus, by minimizing this time constant delay, as by providing a low output impedance for the impedance converting circuits, FET's $Q_{1a}$ and $Q_{1b}$ will respond rapidly to pulse signals applied thereto, and the amplified pulses produced thereby will exhibit sharp leading and trailing edges.

Each stage included in each of the impedance converting circuits also has a relatively low output impedance, and each stage is formed of a pair of complementary transistors whose base electrodes are connected to each other and whose emitter electrodes are connected to each other. Specifically, stage $2A_a$ is formed of NPN transistor $Q_{3a}$ and PNP transistor $Q_{4a}$, the common-connected base electrodes of these transistors being connected to the collector electrode of transistor $Q_{2a}$ is signal supply circuit 1. Stage $2B_a$ is formed of NPN transistor $Q_{5a}$ and PNP transistor $Q_{6a}$, the common-connected base electrodes of these transistors being connected to the common-connected emitter electrodes of transistors $Q_{3a}$ and $Q_{4a}$ in stage $2A_a$. As shown, the common-connected emitter electrodes of transistors $Q_{5a}$ and $Q_{6a}$ are connected to the gate electrode of FET $Q_{1a}$. Stages $2A_b$ and $2B_b$ are of similar construction and serve to apply pulse signals produced at the collector electrode of transistor $Q_{2b}$ in signal supply circuit 1 to the gate electrode of FET $Q_{1b}$.

Suitable DC energizing voltages are supplied to the respective FET's, to signal supply circuit 1 and to each stage included in the impedance converting circuits. FET $Q_{1a}$, transistor $Q_{2a}$ and stages $2A_a$ and $2B_a$ are supplied with positive DC energizing voltages relative to the voltages applied to FET $Q_{1b}$, transistor $Q_{2b}$ and stages $2A_b$ and $2B_b$. More specifically, a maximum positive DC energizing voltage is applied from a DC source $B_{1a}$ through collector resistor $R_{1a}$ to the collector electrode of transistor $Q_{2a}$, and also directly to the collector electrode of transistors $Q_{3a}$ and $Q_{5a}$. A minimum DC energizing voltage, which may even exhibit a negative polarity, is supplied from DC source $B_{2a}$ directly to the collector electrodes of transistors $Q_{4a}$ and $Q_{6a}$. An intermediate DC energizing voltage is supplied from DC source $B_{3a}$ directly to the source electrode of FET $Q_{1a}$. These DC sources may be arranged as shown wherein the maximum DC voltage is obtained from the positive terminal of source $B_{1a}$, the negative terminal of this source being connected to the positive terminal of source $B_{3a}$, the negative terminal of the latter being connected to a reference potential, such as ground, and the positive terminal of source $B_{2a}$ being connected to the positive terminal of source $B_{3a}$. Alternatively, a single DC supply may be provided with suitable taps to derive the respective DC energizing voltages corresponding to sources $B_{1a}$, $B_{2a}$ and $B_{3a}$.

FET $Q_{1b}$, transistor $Q_{2b}$ in signal supply circuit 1 and the impedance converting circuit connected therebetween are electrically symmetrical to FET $Q_{1a}$, transistor $Q_{2a}$ included in the signal supply circuit and the impedance converting circuit connected therebetween. Hence, the DC energizing voltages which are applied to these symmetrical circuits are substantially similar, except for polarity. Thus, a maximum negative DC energizing voltage is supplied from DC source $B_{1b}$ to the collector electrodes of PNP transistors $Q_{2b}$, $Q_{4b}$ and $Q_{6b}$. A minimum DC energizing voltage, which may exhibit positive polarity, is supplied from DC source $B_{2b}$ to the collector electrodes of NPN transistor $Q_{3b}$ and $Q_{5b}$. An intermediate DC energizing voltage is supplied from DC source $B_{3b}$ to the source electrode of FET $Q_{1b}$. DC sources $B_{1b}$, $B_{2b}$ and $B_{3b}$ may be individual sources connected as shown or, alternatively, may comprise a single DC source having respective taps from which the individual DC energizing voltages are derived. As yet a further alternative, all of the illustrated DC sources may be constructed as a single power supply having respective taps whereat the corresponding DC energizing voltages are derived.

A voltage-limiting circuit is connected between FET $Q_{1a}$ and signal supply circuit 1, and another voltage-limiting circuit is connected between FET $Q_{1b}$ and the signal supply circuit. The purpose of the voltage-limiting circuits is to limit the maximum forward bias gate-source voltages which can be applied across the respective FET's. Since the input gate capacitance of the FET is a voltage-dependent quantity, especially when the FET is forward biased, this input capacitance can be maintained at a relatively low, substantially constant level by limiting the forward bias applied to the FET. Since it is desirable not to limit the amplitude of the pulse signals supplied from signal supply circuit 1, voltage-limiting circuits are used to limit the gate-source forward bias voltage. As shown in FIG. 1, each of these voltage-limiting circuits is comprised of a diode. Accordingly, diode $D_{1a}$ is connected between the source electrode of FET $Q_{1a}$ and the collector electrode of transistor $Q_{2a}$; and diode $D_{1b}$ is connected between the source electrode of transistor $Q_{1b}$ and the collector electrode of transistor $Q_{2b}$. Each of these diodes is poled so as to be conductive when the gate-source voltage across the respective FET reaches the forward bias region.

As will be described below, each voltage-limiting circuit may be formed of a number of cascaded diodes. In general, m diodes may be provided in each voltage-limiting circuit, m being an integer 1, 2, 3, ... m, and n $\geq$ m.

The operation of the illustrated circuit now will be described. Let it be assumed that a PWM signal is applied to input terminal $T_1$ having positive and negative cycles. Of course, as is appreciated, any other type of pulse signal or rectangular waveform may be applied to input terminal $T_1$. Transistor $Q_{2a}$ is rendered conductive during the positive half-cycles of the PWM signal and transistor $Q_{2b}$ is rendered conductive during the negative half-cycles. Thus, a pulse signal whose amplitude varies between zero and a positive level is provided at the collector electrode of transistor $Q_{2a}$, and a pulse signal whose amplitude varies between zero and a negative level is provided at the collector electrode of transistor $Q_{2b}$.

When the signal at the collector electrode of transistor $Q_{2a}$ is of a positive level, transistors $Q_{3a}$ and $Q_{5a}$ in stages $2A_a$ and $2B_a$, respectively, are conductive to apply a relatively positive signal to the gate electrode of FET $Q_{1a}$. Thus, transistors $Q_{3a}$ and $Q_{5a}$ function as a charging circuit for the input gate capacitance of FET $Q_{1a}$ to turn this transistor OFF. Since the output impedances of transistors $Q_{3a}$ and $Q_{5a}$ are relatively low, the turn-off delay attributed to this output impedance in cooperation with the inherent input gate capacitance of FET $Q_{1a}$, is short. Hence, the FET is turned OFF abruptly.

When the signal provided at the collector electrode of transistor $Q_{2a}$ is at the approximately zero level, transistors $Q_{3a}$ and $Q_{5a}$ are rendered non-conductive while transistors $Q_{4a}$ and $Q_{6a}$ are conductive. Consequently, a relatively low level signal is applied to the gate electrode of FET $Q_{1a}$, this signal tending to forward bias the FET. Hence, transistors $Q_{4a}$ and $Q_{6a}$ function as a discharge path for the inherent input gate capacitance of FET $Q_{1a}$ so as to discharge this capacitance and turn the FET ON. Since the output impedances of transistors $Q_{4a}$ and $Q_{6a}$ are relatively low, the turn-on delay for FET $Q_{1a}$, attributed to these output impedances in cooperation with the input gate capacitance, is short. Hence, the FET is turned ON abruptly.

Let it be assumed that the base-emitter voltages of transistors $Q_{4a}$ and $Q_{6a}$ are equal to each other and are represented as $V_{BE}$. Let it be further assumed that the forward voltage drop across diode $D_{1a}$ is represented as $V_D$. Consequently, the gate-source voltage $V_{GS}$ of FET $Q_{1a}$ may be expressed as:

$$V_{GS} + V_D = 2V_{BE}$$

If the diode voltage $V_D$ is equal to the base-emitter voltage $V_{BE}$, such as if the illustrated circuit is formed of typical integrated circuit techniques, then $$V_{GS} = V_{BE}$$

Thus, by providing a single diode $D_{1a}$, the forward bias gate-source voltage of FET $Q_{1a}$ is limited to $+V_{BE}$. As a typical numerical example, this limited forward bias gate-source voltage is approximately 0.7 volts.

A similar operation is achieved for turning ON and turning OFF FET $Q_{1b}$. Hence, transistors $Q_{4b}$ and $Q_{6b}$ function as a charging circuit to charge the inherent input gate capacitance of FET $Q_{1b}$ so as to turn this FET OFF. Transistors $Q_{3b}$ and $Q_{5b}$ function as a discharge circuit to discharge the input gate capacitance of FET $Q_{1b}$ and thus turn this FET ON. Diode $D_{1b}$ serves to limit the maximum forward bias gate-source voltage $V_{GS}$ of FET $Q_{1b}$ to $-V_{BE}$. As a typical numerical example, the maximum forward bias which can be applied to FET $Q_{1b}$ because of the illustrated circuit arrangement, and by using only a single diode $D_{1b}$ is equal to $-0.7$ volts.

Diodes $D_{1a}$ and $D_{1b}$ are conductive when FET's $Q_{1a}$ and $Q_{1b}$, respectively, are forward biased and are nonconductive when the respective FET's are turned OFF.

Figure 2:
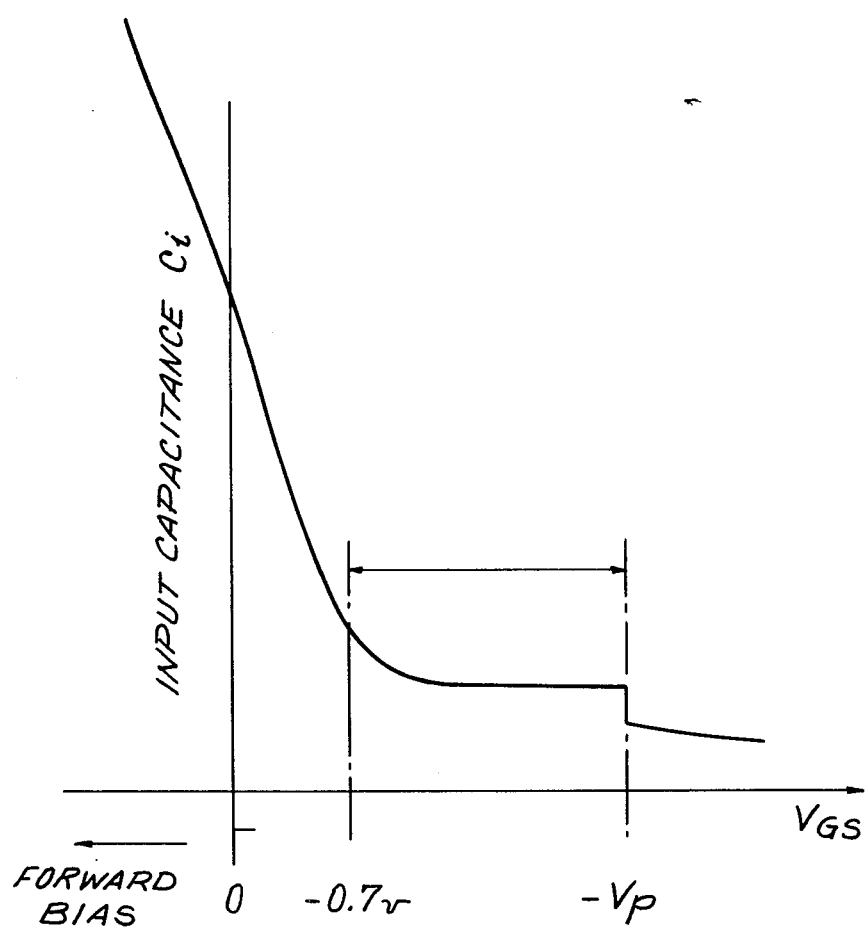
FIG. 2 is a graphical representation between input gate capacitance and gate-source voltage of an FET.

FIG. 2 is a graphical representation of the manner in which the inherent input gate capacitance of, for example, a N-channel FET varies with gate-source voltage. If the gate-source voltage exceeds the pinch-off voltage $-V_p$, the input gate capacitance $C_i$ is relatively low. This capacitance increases when the gate-source voltage is reduced to the pinch-off voltage level $-V_p$ and is substantially constant over the range from $-V_p$ to approximately $-0.7$ volts. When $V_{GS}$ is approximately $-0.7$ volts, the N-channel FET is forward biased and turns ON. If the forward bias condition increases, such as by reducing the gate-source voltage $V_{GS}$ to zero and then increasing that voltage in the positive region, it is seen that the input gate capacitance $C_i$ increases markedly. However, in accordance with the present invention as described above, the forward bias applied to N-channel FET $Q_{1b}$ is limited to $-0.7$ volts, thus maintaining an adequately low value for the input gate capacitance $C_i$. Hence, the delay time in turning OFF this FET is relatively short. Furthermore, because of this relatively low capacitance value, the input power needed to drive the FET and the load coupled thereto is not as great as if the capacitance value is high. Still further, because of the relatively low input gate capacitance value, there is relatively little, if any, power loss.

While FIG. 2 represents the relationship between input gate capacitance $C_i$ and gate-source $V_{GS}$ for a N-channel FET, it is appreciated that a similar relationship exists for a P-channel FET, such as FET $Q_{1a}$. However, by providing a diode $D_{1a}$ in the circuit arrangement shown in FIG. 1, the maximum forward bias which is applied to FET $Q_{1a}$ is limited to $+0.7$ volts. Thus, the input gate capacitance $C_i$ for the P-channel FET $Q_{1a}$ also is maintained at a relatively low value.

Figure 3:
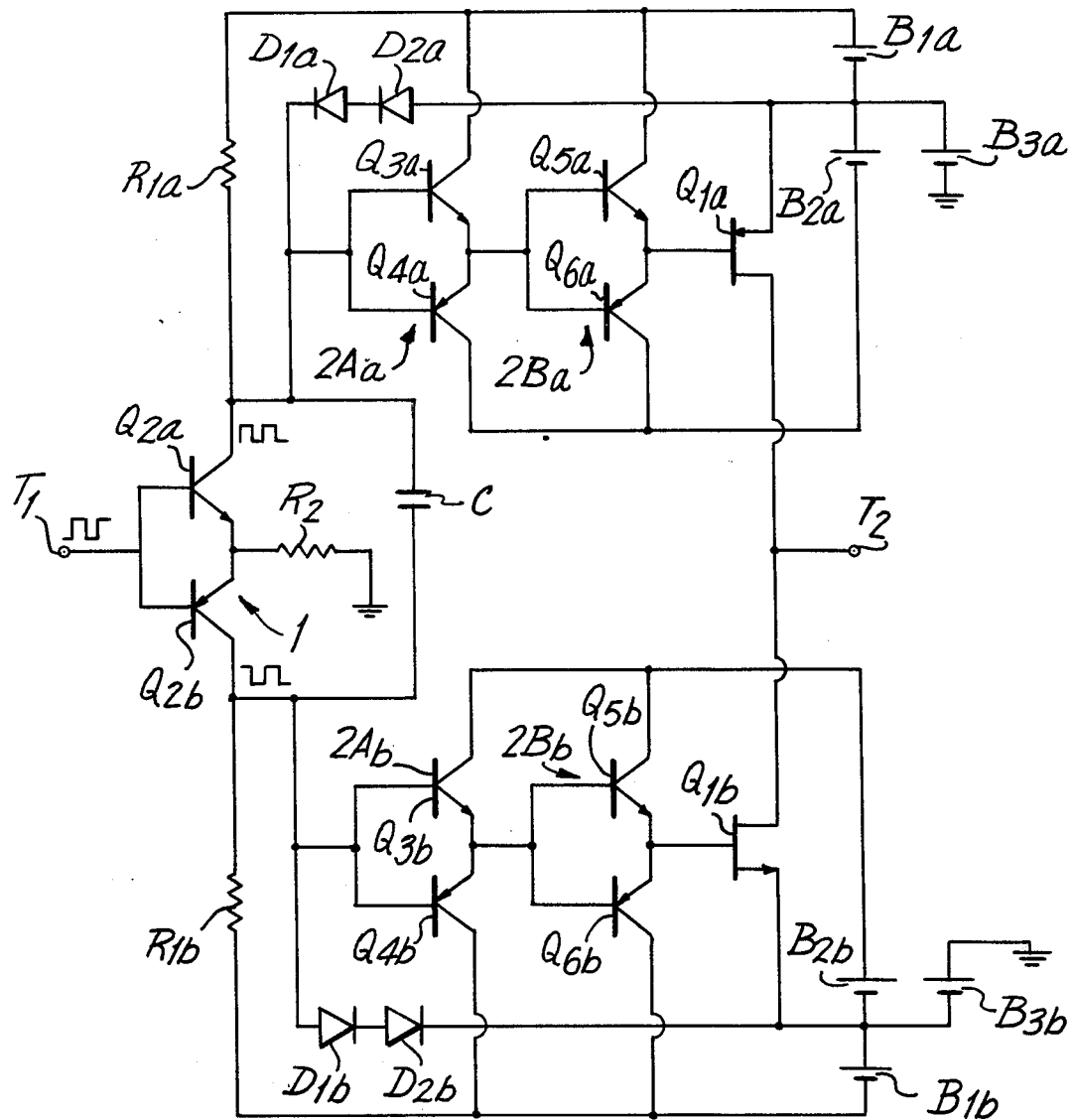
FIG. 3 is a schematic diagram of another embodiment of the present invention.

Another embodiment of this invention is shown schematically in FIG. 3. This alternative embodiment is substantially identical to the embodiment shown in FIG. 1 except that the voltage-limiting circuit provided for FET $Q_{1a}$ includes an additional dioe $D_{2a}$; and the voltage-limiting circuit provided for FET $Q_{1b}$ likewise includes an additional diode $D_{2b}$. With the additional diode, the gate-source voltage for each FET may be found from $$V_{GS} + 2V_D = 2V_{BE}$$

$$V_{GS} = 2V_{BE} - 2V_D$$

$$V_{GS} = 0$$

Hence, the use of two diodes in the voltage-limiting circuit for each of the FET's shown herein is successful in limiting the maximum forward bias voltage of each FET to zero volts. This is an improvement over prior art circuits wherein the forward bias voltage of the FET could exceed zero. That is, in prior art circuits, the forward bias voltage for a N-channel FET could extend to $+0.7$ volts, and the forward bias voltage of a P-channel FET could extend to $-0.7$ volts. As seen from FIG. 2, such forward bias voltages allowed by prior art circuits result in relatively high input gate capacitance values, thereby requiring a higher input power to drive the FET and resulting in higher power loss.

In view of the embodiments shown in FIGS. 1 and 3 and the accompanying description thereof, it now is appreciated that, in accordance with this invention, each impedance converting circuit may be provided with $n$ stages and each voltage-limiting circuit may be provided with $m$ voltage-limiting elements, such as diodes. In the preferred embodiment, $n-m=1$. In the alternative embodiment, $n=m$. Since a N-channel FET might be forward biased at a negative voltage greater than $-0.7$ volts, and since a P-channel FET might be forward biased at a positive voltage greater than $+0.7$ volts, it is contemplated that the difference between the number of stages included in each impedance converting circuit and the number of elements included in each voltage-limiting circuit may be equal to two. Hence, the general expression describing the relation between the number of impedance converting stages and the number of voltage-limiting elements is $n \geq m$.

While the present invention has been particularly shown and described with reference to some embodiments, various changes and modification in form and details may be made by one of ordinary skill in the art without departing from the spirit and scope of the invention. For example, the amplifier configuration with which the teachings of the present invention can be used need not be limited solely to a push-pull arrangement. Hence, FET $Q_{1b}$, transistor $Q_{2b}$, and the impedance converting circuit and voltage-limiting circuit connected therebetween may be omitted. Alternatively, FET $Q_{1a}$, transistor $Q_{2a}$, and the impedance converting circuit and voltage-limiting circuit connected therebetween may be omitted. As another example, each voltage-limiting element need not be limited solely to a diode. Any other PN junction may be used so as to provide a voltage drop thereacross which is equal to the voltage drop across each of the impedance converting stages. Hence, the voltage-limiting diode may be replaced by the base-emitter junction of a bipolar transistor. Similarly, if current amplification in the drive circuits for the FET's is not needed, then the transistors in the impedance converting stages may be replaced by oppositely-poled, parallel diodes. However, in the embodiment wherein FET's $Q_{1a}$ and $Q_{1b}$ are used as a power amplifier to drive a loudspeaker system, such current amplification is preferred. As yet another example, signal supply circuit 1 need not be limited solely to the illustrated configuration. Other supply circuits, such as preamplifiers and the like, may be used.

It is, therefore, intended that the appended claims be interpreted as including the foregoing as well as various other similar modifications and changes.

What is claimed is:
1. An amplifier, comprising:
  a field effect transistor having an input electrode adapted to receive an input signal, a first output electrode adapted to be connected to a load and a second output electrode adapted to be supplied with a DC energizing voltage;
  means for supplying said input signal;

impedance converting means for coupling said input signal supply means to said input electrode of said field effect transistor for applying said input signal thereto, said impedance converting means being formed of n impedance converting stages, each stage having relatively low output impedance; and a circuit connected between said input signal supply means and said second output electrode of said field effect transistor to limit the forward biasing of said field effect transistor, said circuit including $m$ voltage-limiting elements, wherein $n$ and $m$ are integers and $n$ is equal to or greater than $m$.

2. The amplifier of claim 1 wherein the voltage across each stage in said impedance converting means is substantially equal to the voltage across each of said voltage-limiting elements.

3. The amplifier of claim 2 wherein said field effect transistor has an inherent input capacitance and each stage in said impedance converting means includes a capacitance charging circuit of low output impedance and a capacitance discharging circuit of low output impedance.

4. The amplifier of claim 3 wherein each charging and discharging circuit includes a PN junction, and each voltage-limiting element includes a PN junction.

5. The amplifier of claim 4 wherein $(n-m)=1$.

6. The amplifier of claim 4 wherein $n=m$.

7. The amplifier of claim 4 wherein each stage in said impedance converting means is comprised of an NPN transistor and a PNP transistor whose base electrodes are connected to each other and whose emitter electrodes are connected to each other, one of said transistors comprising said charging circuit and the other transistor comprising said discharging circuit; and wherein each of said voltage limiting elements is a diode.

8. The amplifier of claim 7 wherein each diode is poled in a direction to be conductive when said field effect transistor is forward biased to be conductive; whereby said inherent input capacitance of said field effect transistor, which increases as said forward bias increases, is limited to a maximum value.

9. The amplifier of claim 1, further comprising a second field effect transistor connected with the first-mentioned field effect transistor in push-pull relation and including an input electrode adapted to receive an input signal supplied from said input signal supply means, and first and second output electrodes, one of which output electrodes is connected to said first output electrode of said first field effect transistor and the other of which output electrodes is adapted to be supplied with a DC energizing voltage; second impedance converting means for coupling said input signal supply means to said input electrode of said second field effect transistor for applying an input signal thereto, said second impedance converting means being formed of $n$ impedance converting stages, each stage having relatively low output impedance; and a second circuit connected between said input signal supply means and said other output electrode of said second field effect transistor means to limit the forward biasing of said second field effect transistor, said second circuit including $m$ voltage-limiting elements.

10. The amplifier of claim 9 wherein each field effect transistor is a vertical-channel type field effect transistor whose drain electrodes are connected to each other and whose source electrodes are adapted to receive DC energizing voltages.

11. An amplifier, comprising:

first and second field effect transistors connected in push-pull relation, each field effect transistor including gate, source and drain electrodes, one of the source and drain electrodes of said first field effect transistor being connected in common to one of the source and drain electrodes of said second field effect transistor and to an output terminal, and the other of the source and drain electrodes of each field effect transistor being adapted to receive a DC energizing voltage;

input signal supply means for supplying input signals for said first and second field effect transistors;

first and second impedance converting means for coupling said input signal supply means to said first and second field effect transistors, respectively, each of said impedance converting means having a relatively low output impedance; and first and second voltage limiting means connected between said input signal supply means and the source electrodes of said first and second field effect transistors, respectively, to limit the forward biasing of said first and second field effect transistors and thereby limit the maximum inherent input gate capacitance of said first and second field effect transistors.

12. The amplifier of claim 11 wherein each of said impedance converting means is comprised of n impedance converting stages connected in cascade, each stage having a relatively low output impedance; and wherein each of said voltage limiting means is comprised of $m$ voltage limiting elements connected in cascade; wherein $n$ and $m$ are integers (1, 2, . . . ) and wherein $n < m$.

13. The amplifier of claim 12 wherein the voltage across an impedance converting stage is equal to the voltage across a voltage limiting element when the input signal supplied for a respective field effect transistor is sufficient to render that field effect transistor conductive.

14. The amplifier of claim 12 wherein each impedance converting stage is comprised of a capacitance charging circuit and a capacitance discharging circuit through which said inherent input gate capacitance of the respective field effect transistor is charged to turn said field effect transistor OFF and discharged to turn said field effect transistor ON, respectively, in response to a pulse signal.

15. The amplifier of claim 12 wherein each impedance converting stage is comprised of complementary transistors whose base electrodes are connected in common to receive an input signal from said input signal supply means and whose emitter electrodes are connected in common and are coupled to the gate electrode of the respective transistor.

16. The amplifier of claim 15 wherein each voltage limiting element is a diode poled in a direction to be conductive when the respective field effect transistor is forward biased to be conductive.

17. The amplifier of claim 16 wherein $(n-m)=1$.

18. The amplifier of claim 16 wherein $n=m$.

19. The amplifier of claim 11 wherein said input signal supply means is comprised of complementary transistors whose base electrodes are connected in common to receive an input signal and whose emitter electrodes are connected in common; the collector electrode of one of said complementary transistors being coupled to said first impedance converting means and the collector electrode of the other complementary transistor being coupled to said second impedance converting means.

20. The amplifier of claim 19 wherein said common-connected emitter electrodes of said complementary transistors are connected to a reference potential by an impedance; and further comprising capacitance means coupled between the collector electrodes of said complementary transistors.

21. The amplifier of claim 11 wherein said first and second field effect transistors are complementary, vertical channel-type field effect transistors.

* * * * *